(12) United States Patent
Chung et al.

(10) Patent No.: US 10,998,414 B2
(45) Date of Patent: May 4, 2021

(54) METAL GATE STRUCTURE WITH MULTI-LAYER COMPOSITION

(71) Applicant: Taiwan Semiconductor Manufacturing Company, Ltd., Hsinchu (TW)

(72) Inventors: Hung-Chin Chung, Pingzhen (TW); Shiang-Rung Tsai, Hsinchu (TW); Hsien-Ming Lee, DatsuenShiang (TW); Cheng-Lung Hung, Hsinchu (TW); Hsiao-Kuan Wei, Longtan Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/619,103

(22) Filed: Jun. 9, 2017

(65) Prior Publication Data
US 2017/0278941 A1 Sep. 28, 2017

Related U.S. Application Data

(62) Division of application No. 13/871,555, filed on Apr. 26, 2013, now Pat. No. 9,679,984.
(Continued)

(51) Int. Cl.
*H01L 29/49* (2006.01)
*H01L 29/40* (2006.01)
(Continued)

(52) U.S. Cl.
CPC .... *H01L 29/4966* (2013.01); *H01L 21/28079* (2013.01); *H01L 21/28088* (2013.01);
(Continued)

(58) Field of Classification Search
CPC ........... H01L 29/4966; H01L 21/28088; H01L 21/28079; H01L 29/66545; H01L 29/401; H01L 29/78
(Continued)

(56) References Cited

U.S. PATENT DOCUMENTS 6,054,355 A 4/2000 Inumiya et al.
8,652,890 B2 2/2014 Schmidbauer
(Continued)

FOREIGN PATENT DOCUMENTS

CN 102903741 1/2013
JP 2008511176 4/2008
KR 20070078975 8/2007

OTHER PUBLICATIONS

National Center for Biotechnology Information. PubChem Compound Database; CID=6517, http://pubchem.ncbi.nlm.nih.gov/compund/6517 (accessed Jan. 26, 2015).*

*Primary Examiner* — Hoang-Quan Ho
(74) *Attorney, Agent, or Firm* — Haynes and Boone, LLP

(57) ABSTRACT

Methods for forming semiconductor structures are disclosed herein. An exemplary method includes forming a gate structure having a dummy gate stack over a substrate, performing a gate replacement process, such that the dummy gate stack is replaced with a metal gate stack, and forming a non-silane based oxide capping layer over the gate structure. The gate replacement process includes removing a portion of the dummy gate stack from the gate structure, thereby forming a gate trench. A work function layer is formed in the gate trench, a blocking layer is formed in the gate trench over the work function layer, and a metal layer (including, for example, aluminum) is formed in the gate trench over the blocking layer. The blocking layer includes titanium and nitrogen with a titanium to nitrogen ratio that is greater than
(Continued)

one. In some implementations, the work function layer is formed over a dielectric layer.

20 Claims, 4 Drawing Sheets

Related U.S. Application Data

(60) Provisional application No. 61/723,470, filed on Nov. 7, 2012.

(51) Int. Cl.
  *H01L 21/28* (2006.01)
  *H01L 29/66* (2006.01)
  *H01L 29/78* (2006.01)

(52) U.S. Cl.
  CPC ...... *H01L 29/401* (2013.01); *H01L 29/66545* (2013.01); *H01L 29/78* (2013.01)

(58) Field of Classification Search
  USPC .......................................... 257/407, 410–412
  See application file for complete search history.

(56) References Cited

U.S. PATENT DOCUMENTS

| | | |
|---|---|---|
| 2003/0022422 A1 | 1/2003 | Torii et al. |
| 2006/0163630 A1 | 7/2006 | Callegari et al. |
| 2008/0081104 A1* | 4/2008 | Hasebe .................. C23C 16/402 427/58 |
| 2010/0052075 A1* | 3/2010 | Yeh .................. H01L 21/823814 257/410 |
| 2010/0155860 A1* | 6/2010 | Colombo ........... H01L 21/28079 257/412 |
| 2011/0140206 A1 | 6/2011 | Lin et al. |
| 2011/0221009 A1* | 9/2011 | Chuang ............. H01L 21/28088 257/392 |
| 2011/0221012 A1 | 9/2011 | Bu et al. |
| 2011/0223774 A1* | 9/2011 | Kweskin ................ C23C 16/401 438/790 |
| 2011/0241130 A1* | 10/2011 | Chan ..................... H01L 29/401 257/410 |
| 2012/0052641 A1 | 3/2012 | Lee et al. |
| 2012/0211844 A1* | 8/2012 | Schloesser ...... H01L 21/823412 257/410 |
| 2013/0026578 A1* | 1/2013 | Tsau ................. H01L 21/823842 257/368 |
| 2013/0078792 A1 | 3/2013 | Huang et al. |
| 2013/0087856 A1* | 4/2013 | Ortolland .......... H01L 21/28088 257/365 |
| 2013/0130405 A1* | 5/2013 | Verhaverbeke .......... G11B 5/84 438/3 |
| 2013/0161754 A1 | 6/2013 | Su et al. |
| 2013/0200393 A1 | 8/2013 | Chen et al. |
| 2013/0224927 A1* | 8/2013 | Schmidbauer .... H01L 21/28088 438/299 |
| 2013/0249010 A1 | 9/2013 | Ng et al. |
| 2013/0264652 A1 | 10/2013 | Zhu et al. |

* cited by examiner

METAL GATE STRUCTURE WITH MULTI-LAYER COMPOSITION

This application is a divisional of U.S. patent application Ser. No. 13/871,555, filed Apr. 26, 2013, now U.S. Pat. No. 9,679,984, which claims benefit of U.S. Patent Application Provisional Application No. 61/723,470, filed Nov. 7, 2012, the entire disclosures of which are hereby incorporated by reference.

BACKGROUND

In advanced technology nodes of integrated circuit industry, high k dielectric material and metal are adopted to form a gate stack of a field-effect transistor (FET) such as a metal-oxide-semiconductor field-effect transistors (MOSFETs). Metal gate stacks are often planarized, such as by chemical-mechanical polishing (CMP), and it is common to have the resulting gate height after CMP be relatively short. This can result in undesired consequences, such as increased defects (e.g., hump defects) and poor on/off (Ion/Ioff) device performance. Therefore, a structure of a metal gate stack and a method making the same are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
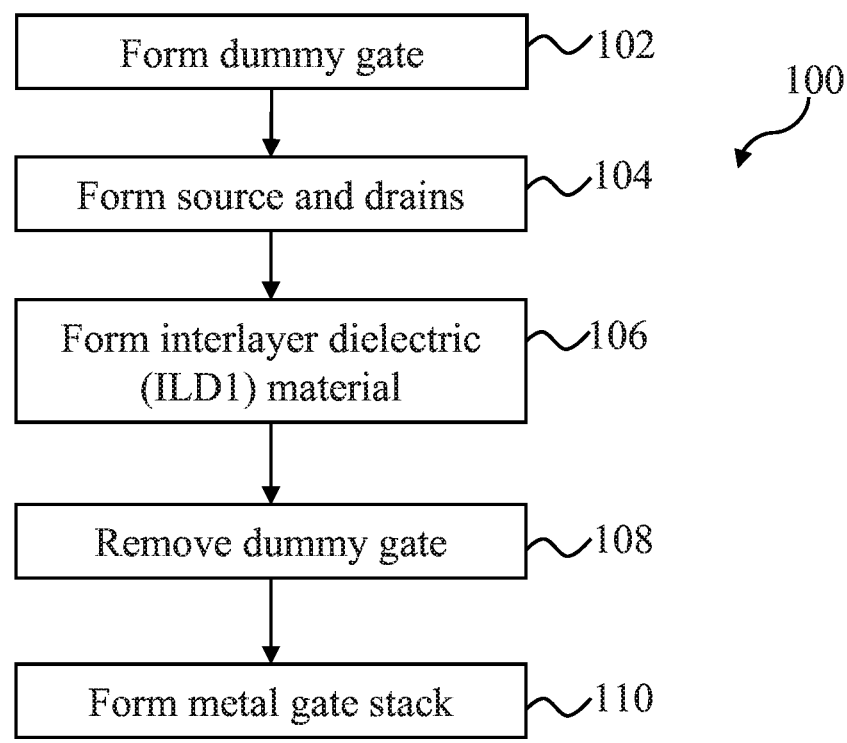
FIGS. 1 and 3 are a flowchart of a method for making a semiconductor device having a metal gate stack constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
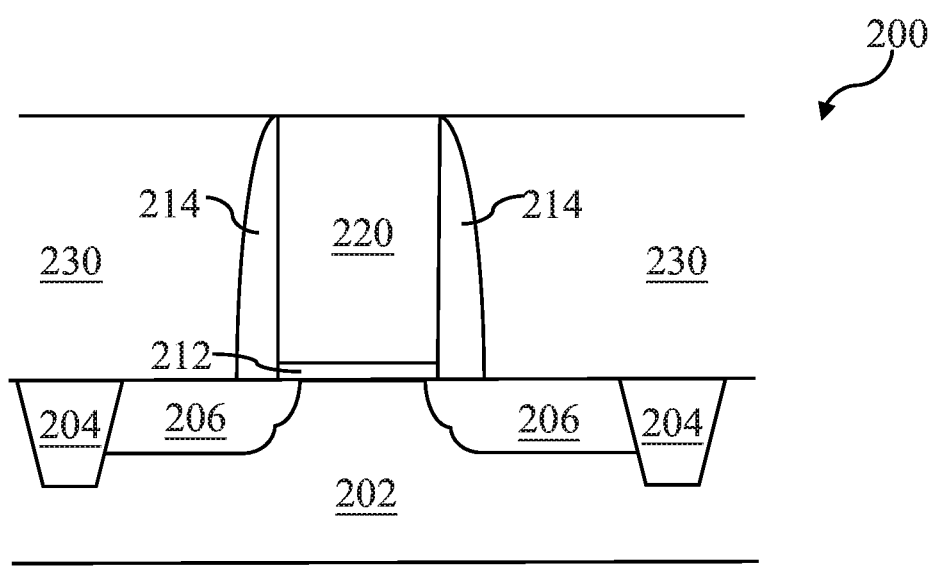
FIGS. 2 and 4 are sectional views of a semiconductor device having a metal gate stack at various fabrication stages constructed according to various aspects of the present disclosure in one or more embodiments.

FIG. 1 is a flowchart of one embodiment of a dummy-gate method 100 for use in making a semiconductor device having a gate stack constructed according to aspects of the present disclosure. FIG. 2 provides a sectional view of one embodiment of a semiconductor structure 200 having a gate stack at various fabrication stages. The semiconductor structure 200 and the method 100 of making the same are collectively described with reference to FIGS. 1 and 2. It is understood that a dummy gate (or gate-last) process is described as an exemplary embodiment, which is not intended to be limiting except and unless as explicitly recited in the claims.

The method 100 begins at step 102 by providing a semiconductor substrate 202. The semiconductor substrate 202 includes silicon. Alternatively, the substrate 202 includes germanium or silicon germanium. In other embodiments, the substrate 202 may use another semiconductor material such as diamond, silicon carbide, gallium arsenic, GaAsP, AlInAs, AlGaAs, GaInP, or other proper combination thereof.

The semiconductor substrate also includes various doped regions such as n-well and p-wells formed by a proper technique, such as ion implantation. The semiconductor substrate 202 also includes various isolation features, such as shallow trench isolation (STI) 204, formed in the substrate to separate various devices. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

Continuing with the present embodiment, a high k dielectric material layer 212 is formed on the semiconductor substrate 202. The high-k dielectric layer 212 includes a dielectric material having the dielectric constant higher than that of thermal silicon oxide, about 3.9. The high k dielectric material layer 212 is formed by a suitable process such as ALD. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes $HfO_2$. Alternatively, the high k dielectric material layer includes metal nitrides, metal silicates or other metal oxides. In addition, an interfacial layer may be formed between the high-k dielectric material layer 212 and the substrate 202.

A polysilicon layer 220 is formed above the high-k dielectric material layer 212. The polysilicon layer 220 is formed by a proper technique, such as CVD. In one example, the polysilicon layer 220 is non-doped. In another example, the polysilicon layer 220 has a thickness between about 500 angstrom and about 1000 angstrom.

The polysilicon layer 220 is patterned, as shown in FIG. 2. Patterning the polysilicon layer 220 can be performed in various manners, such as by using a patterned mask, followed by an etch process. In the present embodiment, the gate dielectric 212 is also patterned. As a result, a dummy gate is formed, as shown in FIG. 2.

Execution proceeds to step 104, in which source and drain features 206 are formed in the substrate 202. In the present embodiment, a gate spacer 214 is formed on the sidewalls of the dummy gate 220. The gate spacer 214 includes one or more dielectric material, such as silicon oxide, silicon nitride, silicon oxynitride or combinations thereof. The source and drain 206 include doping species introduced to the semiconductor substrate 202 by a proper technique, such as ion implantation. In one embodiment, the gate stack is configured in the active region for an n-type field effect transistor (nFET), and the dopant of the source and drain is n-type dopant, such as phosphorus or arsenic. In another embodiment, the gate stack is configured in the active region for a p-type field effect transistor (pFET), and the dopant of the source and drain is p-type dopant, such as boron or gallium. In yet another embodiment, the source and drain 206 include light doped drain (LDD) and heavily doped features, as shown in FIG. 2.

The method 100 proceeds to step 106 by forming an interlayer dielectric (ILD) 230 on the substrate. The ILD 230 is deposited by a proper technique, such as CVD. The ILD 230 includes a dielectric material, such as silicon oxide, low k dielectric material or a combination. A chemical mechanical polishing (CMP) process may be applied thereafter to planarize the surface of the ILD 230.

The method 100 proceeds to step 108 by removing the polysilicon layer 220, resulting a gate trench. The polysilicon is removed by a suitable etching process, such as wet etch. At step 110, a metal gate stack is formed in the gate trench, which is discussed in greater detail below with reference to FIGS. 3 and 4.

Figure 3:
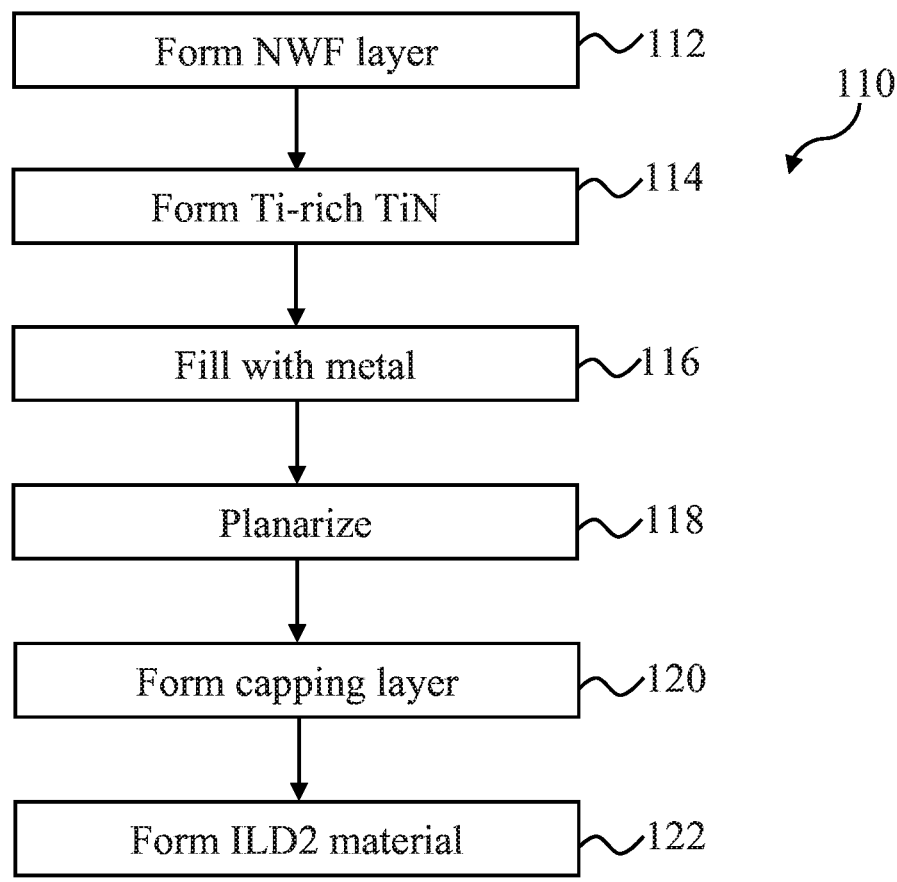
Figure 4:
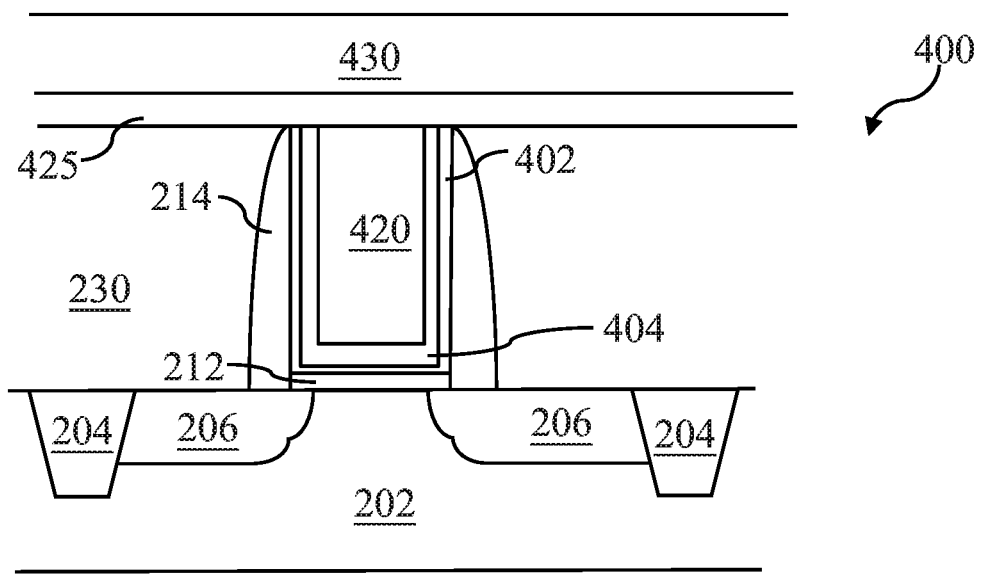

Referring to FIG. 3, forming the metal gate stack begins at step 112 by forming a first metal layer 402 having a proper work function. The first metal is also referred to as work function metal. For an nFET, the first metal 402 has a work function substantially equals to or less than about 4.4 eV, referred to as n metal. For a pFET, the first metal 402 has a work function substantially equals to or greater than about 4.8 eV, referred to as p metal. In the present example, an n metal work function (NWF) layer is formed, and includes tantalum or titanium aluminum. In another example, the p metal includes titanium nitride or tantalum nitride. The work function metal 402 is deposited by a suitable technique. In the present embodiment, the NWF is deposited by PVD.

At step 114, a blocking layer 404 is formed above the work function metal. Continuing with the example above, the blocking layer is a TiN layer. The TiN layer is titanium-rich, meaning that Ti/N >1. In the present embodiment, the TiN is deposited by PVD.

At step 116, a fill metal material 420 is deposited in the trench, above the blocking layer 404. In the present embodiment, the fill metal material 420 includes aluminum, although it is understood that other embodiments may be provided, such as aluminum copper alloy. The fill metal material 420 is deposited by a suitable technique, such as PVD or plating. At step 118, the metal gate is planarized. In one embodiment, a CMP process is applied to remove the excessive metals, including any metals disposed on the ILD 230. The combination of the layers 402, 404, and 420 form a replacement metal gate for the trench left over from the polysilicon dummy gate 220 (FIG. 2). It is understood that additional layers may also be included in the replacement metal gate.

At step 120, a capping layer is formed over the replacement metal gate. In the present embodiment, a non-silane oxide layer 425 is deposited on the replacement metal gate, such as by chemical vapor deposition (CVD) or atomic layer deposition (ALD). In more specific embodiments, the non-silane oxide layer includes TEOS ($Si(C_2H_5O)_4$) or SAM24 ($C_8H_{22}N_2Si$) according to one of the following formulas:

$$TEOS + O_2 \; w/i \; HF \; plasma => SiO_2 \quad (1)$$

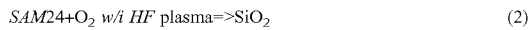

$$SAM24 + O_2 \; w/i \; HF \; plasma => SiO_2 \quad (2)$$

Equation (1) is an example of plasma-enhanced TEOS, and equation (2) is an example of ALD oxide.

At step 122, a second ILD 430 is formed on the substrate. The ILD 430 is deposited by a proper technique, such as CVD or spin-on glass. The ILD 430 includes a dielectric material, such as silicon oxide, low k dielectric material or a combination. A chemical mechanical polishing (CMP) process may be applied thereafter to planarize the surface of the ILD 430.

Other processing steps may follow to form a functional circuit. For example, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

The present disclosure is not limited to applications in which the semiconductor structure includes a filed effect transistor, such as a metal-oxide-silicon (MOS) transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metal. The footing procedure may implement other effective cleaning procedure. The disclosed method is used to but not limited to form one transistor, such as an n-type metal-oxide-semiconductor field-effect-transistor (nMOSFET). For example, a plurality of nMOSFETs and a plurality of p-type metal-oxide-semiconductor field-effect-transistors (pMOSFETs) are formed in the same substrate, the nMOSFETs and pMOSFETs are formed in a collective procedure where some features are respectively formed. In a particular example, the n metal is formed in the nMOSFET regions while pMOSFET regions are covered from the deposition of n metal.

In another embodiment, the semiconductor substrate may include an epitaxial layer. For example, the substrate may have an epitaxial layer overlying a bulk semiconductor. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

According to one embodiment, the present disclosure describes a semiconductor structure. The semiconductor structure includes a semiconductor substrate and a gate stack disposed on the semiconductor substrate. The gate stack includes a high-k dielectric material layer, a titanium-rich TiN layer over the high-k dielectric layer, and a metal layer disposed over the titanium-rich TiN layer. In some embodiments, the metal layer includes aluminum.

The present disclosure also describes another semiconductor structure, including a semiconductor substrate and a gate stack disposed on the semiconductor substrate. The gate stack in this embodiment includes a high-k dielectric material layer, a metal layer disposed over the high-k dielectric material layer, and a non-silane based oxide capping the metal layer. In some embodiments, the metal layer includes aluminum.

The present disclosure also describes a method of forming a semiconductor structure. The method includes forming a working function layer over the semiconductor substrate, forming a titanium-rich TiN layer over the working function layer, and forming a metal gate structure over the titanium-rich TiN layer. In some embodiments, the metal gate includes aluminum. Also in some embodiments, the method includes forming a capping layer over the metal gate structure; the capping layer formed using a non-silane oxide process.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a dummy gate stack over a substrate, the dummy gate stack comprising a dielectric layer and a polysilicon layer over the dielectric layer;
   performing a gate replacement process to form a gate structure that includes a metal gate stack, wherein the gate replacement process includes:
      removing the polysilicon layer, thereby forming a gate trench and exposing the dielectric layer;
      forming an n-type work function layer in the gate trench and directly on the dielectric layer;
      forming a blocking layer in the gate trench directly on the n-type work function layer, wherein the blocking layer includes titanium (Ti) and nitrogen (N) with a titanium to nitrogen ratio (Ti/N) that is greater than one, wherein the blocking layer is formed of a different material than the n-type work function layer, and
      forming a metal layer in the gate trench over the blocking layer; and forming an oxide capping layer over the gate structure.
2. The method of claim 1, wherein the forming the dummy gate stack includes:
   forming the dielectric layer over the substrate;
   forming the polysilicon layer over the dielectric layer; and
   patterning the dielectric layer and the polysilicon layer to form the dummy gate stack over the substrate.
3. The method of claim 2, further comprising:
   before the removing of the polysilicon layer, forming gate spacers along sidewalls of the dummy gate stack.

4. The method of claim 2,
   wherein the dielectric layer comprises hafnium oxide,
   wherein the n-type work function layer comprises tantalum or titanium aluminum.
5. The method of claim 1, wherein the metal layer includes aluminum.
6. The method of claim 1, wherein the forming the oxide capping layer includes using a $C_8H_{22}N_2Si$ containing precursor.
7. The method of claim 1, wherein the forming the oxide capping layer includes using a $Si(C_2H_5O)_4$ containing precursor.
8. The method of claim 1, further comprising:
   before performing the gate replacement process, forming a first interlevel dielectric layer over the substrate; and
   after performing the gate replacement process, forming a second interlevel dielectric layer over the oxide capping layer.
9. A method comprising:
   depositing an n-type work function layer directly on a dielectric layer;
   depositing a titanium-rich layer directly on the n-type work function layer, wherein the titanium-rich layer has a titanium to nitrogen ratio (Ti/N) that is greater than one, wherein the titanium-rich layer is formed of a different material than the n-type work function layer;
   depositing a metal layer over the titanium-rich layer, wherein the dielectric layer, the n-type work function layer, the titanium-rich layer, and the metal layer form a gate stack of a gate structure disposed over a substrate; and
   forming a capping layer directly on a top surface of the n-type work function layer, a top surface of the titanium-rich layer, and a top surface of the metal layer such that the capping layer physically contacts the respective top surfaces of the n-type work function layer, the titanium-rich layer and the metal layer.
10. The method of claim 9, wherein the forming of the capping layer includes performing a deposition process using a precursor to form a capping layer over the gate stack.
11. The method of claim 10, wherein the precursor is a $C_8H_{22}N_2Si$ containing precursor.
12. The method of claim 10, wherein the precursor is a $Si(C_2H_5O)_4$ containing precursor.
13. The method of claim 9, further comprising:
   forming a dummy gate stack over a substrate, wherein the dummy gate stack includes a polysilicon layer disposed over the dielectric layer; and
   removing the polysilicon layer to form a trench, wherein the trench is filled by the n-type work function layer, the titanium-rich layer, and the metal layer.
14. The method of claim 13, wherein:
   the n-type work function layer is deposited along sidewalls of gate spacers defining a width of the trench; and
   the titanium-rich layer is deposited along sidewalls of the n-type work function layer.
15. A method comprising:
   forming a gate structure over a substrate, wherein the gate structure includes a gate stack and gate spacers disposed along sidewalls of the gate stack, and further wherein the gate stack includes a dielectric layer and a polysilicon layer;
   after forming a first interlevel dielectric layer over the substrate, replacing the polysilicon layer of the gate stack with:
      an n-type work function layer disposed directly on the dielectric layer, a blocking layer disposed directly on the n-type work function layer, wherein the blocking layer includes titanium (Ti) and nitrogen (N) with a titanium to nitrogen ratio (Ti/N) that is greater than one; and a fill layer that includes aluminum disposed on the blocking layer;

forming an oxide capping layer over the gate structure and the first interlevel dielectric layer; and forming a second interlevel dielectric layer over the oxide capping layer.

16. The method of claim 15, wherein forming the oxide capping layer includes using a $Si(C_2H_5O)_4$ containing precursor.

17. The method of claim 15, wherein forming the oxide capping layer includes performing an atomic layer deposition process using a $C_8H_{22}N_2Si$ containing precursor.

18. The method of claim 15, planarizing a top surface of the gate structure and the first interlevel dielectric layer before forming the oxide capping layer.

19. The method of claim 9, wherein the capping layer includes an oxide material.

20. The method of claim 15, wherein the n-type work function layer is formed of a different material than the blocking layer.

* * * * *